United States Patent [19]

Kasuga

[11] Patent Number: 4,542,369

[45] Date of Patent: Sep. 17, 1985

[54] DIGITAL-TO-ANALOG CONVERTING DEVICE

[75] Inventor: Masao Kasuga, Sagamihara, Japan

[73] Assignee: Victor Company of Japan, Ltd., Kanagawa, Japan

[21] Appl. No.: 522,057

[22] Filed: Aug. 10, 1983

[30] Foreign Application Priority Data

Aug. 19, 1982 [JP] Japan ................. 57-143626
Dec. 23, 1982 [JP] Japan ................. 57-230162

[51] Int. Cl.⁴ ............................................ H03K 13/02
[52] U.S. Cl. ..................... 340/347 DA; 340/347 M
[58] Field of Search ............... 340/347 DA, 347 AD, 340/347 M, 347 NT; 364/733

[56] References Cited

U.S. PATENT DOCUMENTS 3,317,905 5/1967 Hunt ........................ 340/347 DA
4,209,773 6/1980 Everard .................. 340/347 DA Primary Examiner—B. Dobeck
Attorney, Agent, or Firm—Ladas & Parry

[57] ABSTRACT

A digital-to-analog converting device comprises a signal processing circuit supplied with a discrete digital signal $x_n$ at a time nT, where n is a natural number and T is a sampling period, for converting the discrete digital signal $x_n$ into a digital signal $y_n$ satisfying an equation $$y_n = \sum_{i=0}^{N} x_{n-i} - \sum_{i=1}^{N} y_{n-i},$$

where N is a natural number greater than i, a digital-to-analog converter for converting the output digital signal $y_n$ of the signal processing circuit into an analog signal having a continuous amplitude, and an analog lowpass filter supplied with the output analog signal of the digital-to-analog converter, for eliminating frequency components substantially equal to or higher than ½ a sampling frequency $F_s$ of the discrete input digital signal of the signal processing circuit.

6 Claims, 14 Drawing Figures

DIGITAL-TO-ANALOG CONVERTING DEVICE

BACKGROUND OF THE INVENTION

The present invention generally relates to digital-to-analog converting devices, and more particularly to a digital-to-analog converting device which converts a discrete digital signal into an analog signal having a continuous amplitude with substantially no deterioration in the signal quality.

Recently, there has been a rapid progress in large scale integrated (LSI) circuit techniques, and the rapid progress is particularly notable in digital LSI circuit techniques. With such technical progress in these fields, precision of circuit elements has improved, and it is becoming possible to downsize circuit devices and reduce the manufacturing cost of the circuit devices. For this reason, it is becoming more popular to subject an analog information signal to a digital signal processing, especially when transmitting an audio signal. That is, the analog information signal is subjected to a digital pulse modulation such as a pulse code modulation (PCM) and converted into a digital signal format to be transmitted through a transmitting medium or to be processed, and the digital signal is thereafter restored to the original analog information signal. Such a digital signal processing technique is applied to various devices, and reduced to practice.

As is well known, a high signal-to-noise (S/N) ratio can be obtained according to the above digital signal processing system. Moreover, it is possible to obtain a large dynamic range. In addition, the signal quality will not become deteriorated if sufficiently long data words and operation words are reserved when transmitting and processing a signal through the transmitting medium. These advantageous features help prevent the signal quality from being deteriorated, especially when transmitting a high-quality music signal through a recording medium such as a tape and a disc, changing the sound quality of the music signal frequently a plurality of times, and carrying out a signal processing such as mixing of the music signal with other signals. Thus, it is particularly suited to apply these digital signal processing in transmission of an audio signal. Accordingly, attention is recently being drawn towards digital audio systems, and a digital audio disc (DAD) for home use has already been reduced to practice.

However, even in the digital processing system, conventional analog circuits are used in input and output circuits, to carry out conversion of an analog signal into a digital signal and vice versa. That is, an analog-to-digital (A/D) converter is required for converting an input analog signal into a digital signal $x_n$ having a predetermined data word length (number of bits) n, and a digital-to-analog (D/A) converter is required for limiting a digital signal $y_n$ to a predetermined word length and for converting the digital signal $y_n$ into an analog signal. Because these converting processes involve the A/D converter and D/A converter which have resolutions of predetermined data word lengths, noise due to error between the analog signal and the quantized signal, that is, quantization noise is inevitably introduced by the conversion.

If the original analog signal is in the low frequency range, the quantization noise called granular noise is generated in the A/D converter because the quantization level is limited. In addition, if the level of the original analog signal is low (if the effective data word length is short in the case of a digital signal), the otuput signal waveform becomes a square wave when the original analog signal is sampled. This output signal includes much harmonic distortion, and the harmonic distortions may be detected by the listener as an unpleasant sound or noise.

Such noise was a substantial problem in the digital audio system in which the signal quality was of much importance. That is, in the digital audio system, the PCM digital music signal is subjected to change in the sound quality in a variable attenuation equalizer and the like, or subjected to a mixing process, and the operation word length is normally set longer than the data word length of the signal to reduce the operation error in order to prevent the signal quality from being deteriorated when carrying out such a process. However, although the input digital signal $y_n$ of the D/A converter has a sufficiently long data word length, quantization noise is generated due to truncation of the data word length of the input digital signal of the D/A converter, because the resolution of the D/A converter is limited to the predetermined number of bits.

In addition, in order to obtain a wide passband in accordance with the sampling theorem, a passband edge frequency or passband cutoff frequency $f_p$ of an analog lowpass filter connected to the output of the D/A converter is set to a frequency which is exceedingly close to a stopband edge frequency or stopband cutoff frequency $f_s$ of the analog lowpass filter. Further, the above frequencies $f_p$ and $f_s$ satisfy a relation $f_p < f_s \leq F_s/2$, where $F_s$ is the sampling frequency of the output digital signal of the D/A converter. Hence, the above analog lowpass filter has a characteristic in which a transition frequency band between the passband edge frequency $f_p$ and the stopband edge frequency $f_s$ is narrow, that is, the transition between the passband edge frequency $f_p$ and the stopband edge frequency $f_s$ is sharp.

For example, when transmitting an audio signal, the transition band is only about 5 kHz, since the passband edge frequency $f_p$ is in the range of 20 kHz and the sampling frequency $f_1$ is in the range of 50 kHz. On the other hand, the attenuation or loss of the analog lowpass filter corresponds to the quantization bit number of the digital signal, and an attenuation of $-96$ dB is required when the quantization bit number is 16. Accordingly, the attenuation characteristic of the analog lowpass filter must be extremely sharp, that is, the transition between the passband edge frequency and the stopband edge frequency must be sharp, and conventionally, an elliptic filter having its order of the filter in the range of 11 to 13 was designed and used in most cases.

However, because the attenuation characteristics must be extremely sharp as described above, it was difficult to obtain a desired attenuation due to the precision of circuit elements. In addition, deviation from designed values had to be tolerated with, and the generation of ripple within the passband had to be tolerated with in order to obtain the desired attenuation. Further, the scale of the filter became large. Therefore, various problems were introduced in designing and making the analog lowpass filter. Moreover, if an attempt was made to obtain a sharp attenuation characteristic, the phase versus frequency characteristic of the analog lowpass filter inevitably became a characteristic in which the phase greatly varies in a range of $+\pi$(radians) within the passband below the pasband edge frequency $f_p$, for example, and it was impossible to suppress such great phase variation. Accordingly, there was a serious disadvantage in that the signal quality of the converted analog signal especially with respect to its phase became deteriorated.

In addition, even when the A/D converter and the D/A converter use 16 bits, it has been found that the actual performance of the converters was in the range of 14.5 bits. Thus, the fundamental performance of the converters were not being sufficiently obtained.

Hence, various methods were heretofore employed in order to reduce the quantization noise. For example, the resolution or number of bits of the D/A converter as increased by using the existing LSI technique. As another example, there was a method of constantly varying the minimum quantization level (the magnitude of the least significant bit) according to the signal characteristic so as to increase the apparent quantization word length, such as companded quantization or polygoral line quantization.

Furthermore, there was a method of reducing the quantization noise by use of white noise called dither. According to this method, a first white noise is superimposed to the analog signal and the superimposed signal was supplied to an A/D converter. A digital signal obtained from this A/D converter was then passed through a transmitting medium and a D/A converter, to obtain an analog signal in which the white noise is superimposed. A second white noise generated independently, was subtracted from the output analog signal of this D/A converter, to obtain the original analog signal. Thus, the quantization nosie was subjected to noise variance, and the distortion component was reduced.

In addition, there was a device for carrying out D/A conversion at twice the normal speed by inserting a digital filter at a stage preceding the D/A converter and converting the sampling frequency of twice the normal sampling frequency, in order to eliminate the various problems of the analog lowpass filter which is connected to the output side of the D/A converter. According to this device, the construction of the analog lowpass filter was simplified by effectively using the digital fitler which is easily designed to have a certain performance, and facilitated the designing and making of the analog lowpass filter. Moreover, it was possible to improve the signal quality of the analog signal (video signal, for example) which has passed through the filter. Thus, this device was effective when applied to a system in which the phase characteristic became a problem (refer to "Digital Interpolation System in A/D and D/A Conversion" by Ninomiya, NHK Technical Report, October 1979, page 405).

However, among the above methods of reducing the quantization noise employed heretofore, it would be easier to speed up the conversion time, for example, than employ the method of increasing the resolution of the D/A converter. This is because a D/A converter having a resolution of 16 bits has already been reduced to practice in the digital audio system in which there is a demand for signal transmission of particularly high quality, and from the point of circuit precision, circuit stability, and cost, it is difficult to further increase the resolution of the D/A converter. In addition, regarding the method of reducing the quantization noise by a non-linear quantization such as companded quantization, the noise is not substantially reduced because the quantization level is high at points where the signal level is high. Moreover, there is a problem in that the quantization noise such as granular noise is not reduced satisfactorily.

The method of reducing the quantization noise by use of the dither worked on the premise that the a first dither generator for generating the first white noise and a second dither generator for generating the second white noise are synchronized, and that a subtracting circuit carries out the subtraction of the second white noise from the analog signal in which the first white noise is superimposed. Thus, this method suffered a disadvantage in that the system became complex. When a recording medium such as a tape and disc was used, there were further disadvantages in that difficulty was introduced in obtaining compatibility with conventional systems because of the need to assure synchronism, that additional circuit systems were required, and the like. In a system in which the mixed dither cannot be subtracted, a method of simply adding noise and carrying out quantization was known in the case of video processing. However, the effect of noise variance could not be obtained unless the amplitude of the noise (dither) was large compared to the minimum quantization level. It is also known for the case of the audio signal that the noise increases and the S/N ratio becomes poor according to the input signal level, when such noise variance effect cannot be obtained. Therefore, there were problems in that the frequency of the noise which is added entered within the signal frequency band to cause deterioration of the signal quality, and that it was not practical to use noise having a frequency outside the signal frequency band.

On the other hand, in the conventional device in which the digital filter is inserted in a stage preceding the D/A converter and the sampling frequency is set to twice the normal sampling frequency so as to facilitate the design of the analog lowpass filter, it was necessary to increase the number of bits of the D/A converter by one when designing the digital filter. In addition, when designing the analog lowpass filter, measures had to be taken to attenuate the level increase caused by the increase by one bit, and this made it difficult to design the filter.

Further, a so-called noise shaping is known, according to which the quantization error is inverted with respect to the input digital signal and fed back to a stage preceding the D/A converter (for example, refer to Philips Technical Review 40, pp174–179, 1982, No. 6). However, the feedback cannot respond quick enough with respect to the high-frequency signal according to this method, and a type of over load noise is introduced. For example, the resolution increases by one bit when the digital signal is varying within a minimum quantization level $\Delta$, however, the signal close to the quantization value ($\Delta$, $2\Delta$) passes unchanged. Thus, the quantization error becomes close to zero, and the feedback quantity becomes equal to zero, which means that the output value becomes equal to the value of the quantization level. Accordingly, the response of the signal which is obtained by passing the above signal through the D/A converter and the analog lowpass filter with respect to a rapidly rising signal (high-frequency signal) becomes poor. Therefore, there was a problem in that the effect of cancelling the quantization error with respect to the high-frequency range signal was poor, because the over load noise is introduced.

SUMMARY OF THE INVENTION

Accordingly, it is a general object of the present invention to provide a novel and useful D/A converting device in which the various problems described heretofore have been eliminated.

Another and more specific object of the present invention is to provide a D/A converting device in which a sampling frequency $F_s$ of a discrete input digital signal is multiplied by M (where M is a natural number equal to or greater than 2) before supplying the input digital signal to a D/A converter, and an output analog signal of the D/A converter is passed through an analog lowpass filter having a passband edge frequency which is selected to a frequency substantially equal to or greater than ½ the sampling frequency $F_s$ and having a stopband edge frequency which is selected to a frequency substantially equal to or less than $(M+1)/2$ times the sampling frequency $F_s$. According to the device of the present invention, the transition frequency band of the analog lowpass filter can be made considerably wider compared to the transition frequency band obtained according to a conventional device. Thus, the designing and making of the analog lowpass filter is greatly facilitated. The scale of the filter can also be reduced. In addition, it is possible to prevent deviation from designed values due to inconsistencies in the circuit elements, and the circuit of the analog lowpass filter can be simplified. Further, the phase versus frequency characteristic of the analog lowpass filter obtained when the output analog signal is in a predetermined frequency band, can be approximated to a linear phase, and for this reason, it is possible to prevent phase distortion. Therefore, the signal quality of the analog signal obtained by the device according to the present invention is far superior compared to the signal quality of the analog signal obtained by a conventional device.

Still another object of the present invention is to provide a D/A converting device in which a signal processing circuit which converts a digital signal $x_n$ at a time nT, where n is a natural number and T is the sampling period, and produces a digital signal $y_n$ described by an equation $$y_n = \sum_{i=0}^{N} x_{n-i} - \sum_{i=1}^{N} y_{n-i}$$

where N is a natural number and N is greater than i, is provided in an input stage of the D/A converter. According to the device of the present invention, the resolution of the D/A converter can be improved in essence by at least one or more bits regardless of the level and frequency of the signal. Thus, the quantization noise can be reduced by this improvement in the resolution. In addition, since the resolution of the D/A converter is not actually increased by one bit, the filter can be designed easily, and the circuit construction is simple compared to a conventional device which uses dither. Further, the device according to the present invention assures compatibility when reproducing recorded signals from a conventional recording medium.

Another object of the present invention is to provide a D/A converting device which subjects a digital signal which has been successively passed through a sampling rate converter for increasing the sampling frequency of the discrete input digital signal and the above signal processing circuit, to a D/A conversion. According to the device of the present invention, it is possible to reduce the harmonic distortion. Moreover, even with respect to a digital signal which is obtained by adding dither and carrying out A/D conversion, the mean of the signal can be obtained by a digital lowpass filter within the sampling rate converter. Further, even with respect to a digital signal which has an unstable least significant bit (LSB), the mean of the signal can be obtained similarly. In either of these cases, it is possible to obtain an analog signal in which the quantization noise and the like are reduced, as in the case where the input signal is a normal digital signal.

Other objects and further features of the present invention will be apparent from the following detailed description when read in conjunction with the accompanying drawings.

DETAILED DESCRIPTION

Figure 1:
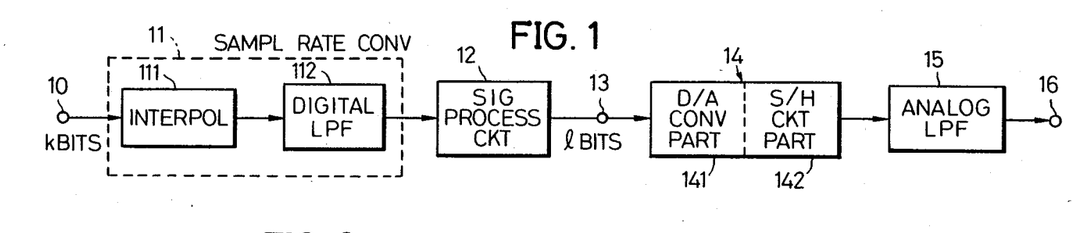
FIG. 1 is a systematic block diagram showing an embodiment of a D/A converting device according to the present invention.
Figure 2:
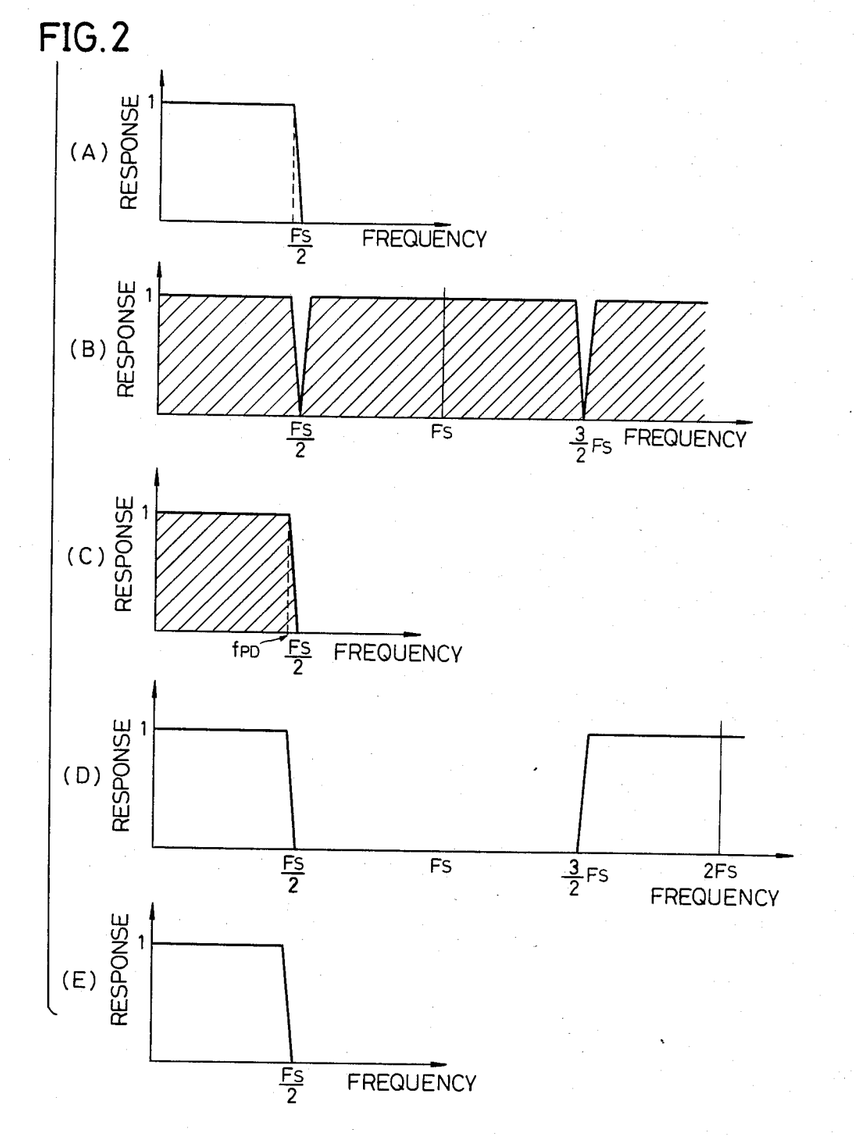
FIGS. 2(A) through 2(E) are graphs respectively showing frequency spectrums of signals at each part of the block system shown in FIG. 1.

In FIG. 1, a digital signal is applied to an input terminal 10. For example, this digital signal is a PCM signal having a quantization bit number of k bits, which is obtained by sampling an analog audio signal with a sampling frequency $F_s$ and thereafter subjecting the sampled signal to quantization and encoding. This digital signal is supplied to a sampling rate converter 11. The sampling rate converter 11 is constituted by an interpolaror 111 and a digital lowpass filter 112 which are connected in series. The interpolator 111 is a circuit for inserting $(M-1)$ zeros within time intervals between each of the sampled values of the input digital signal (digital signal values obtained with a sampling period T), where M is a natural number equal to or greater than 2. Thus, the sampling frequency is in essence multiplied by M, and the interpolator 111 produces a digital signal having a sampling frequency $M \cdot F_s$. Accordingly, when M is equal to 2, for example, the input digital signal having a frequency spectrum shown in FIG. 2(A) is converted into a digital signal having a sampling frequency $2F_s$ in the interpolator 111. This converted signal produced from the interpolator 111 has a frequency spectrum shown in FIG. 2(B), and is supplied to the digital lowpass filter 112.

As shown in FIG. 2(B), the digital signal having the sampling frequency $2F_s$ includes frequency components higher than or equal to a frequency $F_s/2$, however, signal components exist at frequencies lower than or equal to the frequency $F_s/2$. Hence, the digital lowpass filter 12 has an amplitude versus frequency characteristic indicated by a solid line I in FIG. 3, so as to frequency-select the signal components in the frequencies lower than or equal to the frequency $F_s/2$. A stopband edge frequency $f_{SD}$ in the amplitude versus frequency characteristic is selected to a frequency lower than or equal to the frequency $F_s/2$. In the characteristic indicated by a solid line I in FIG. 3, the stopband edge frequency $f_{SD}$ is set equal to the frequency $F_s/2$ and higher than a passband edge frequency $f_{PD}$. Accordingly, the frequency spectrum of the output signal of the digital lowpass filter 12 becomes as shown in FIG. 2(C). In FIGS. 2(A) through 2(E), the frequency spectrums indicated with oblique lines are those of the digital signal having the sampling frequency $2F_s$, and the frequency spectrums without the oblique lines are those of the digital signal having the sampling frequency $F_s$.

Normally, the above digital lowpass filter 112 is designed as a finite impulse response (FIR) digital filter. However, if the phase versus frequency characteristic is not of much significance, the digital lowpass filter 112 may be designed as an infinite impulse response (IIR) digital filter. In this case, it should be noted that the passband ripple must be selected so that the number of bits of a D/A converter 14 which will be described hereinafter need not be increased. In other words, the passband ripple must be in an allowable range without requiring the number of bits in the D/A converter 14 to be increased.

For example, the digital lowpass filter 112 in which the passband edge frequency $f_{PD}$ is set to 20 kHz and the stopband edge frequency $f_{SD}$ is set to 22.05 kHz, and is capable of obtaining an attenuation of $-96$ dB in the transition band between the frequencies $f_{PD}$ and $f_{SD}$, may be constituted by an FIR digital filter having its order k of the filter set to 186.

The digital signal having the sampling frequency $M \cdot F_s$ which is obtained from the sampling rate converter 11, is supplied to a signal processing circuit 12 which will be described in detail hereinafter. The signal processing circuit 12 carried out a signal processing satisfying the following difference equation (1), where $x_n$ is the value of the input digital signal at a time nT, $y_n$ is the value of the output digital signal at the time nT, and T is the sampling period which is equal to $1/F_s$.

$$y_n = \sum_{i=0}^{N} x_{n-i} - \sum_{i=1}^{N} y_{n-i} \quad (1)$$

The digital signal $y_n$ having a quantization bit number of l bits and obtained from the signal processing circuit 12, is supplied to the D/A converter 14 which operates at a speed of $M \cdot F_s$, through an output terminal 13.

The D/A converter 14 comprises a D/A converter part 141 and a sample-and-hold (S/H) circuit part 142. This D/A converter 14 subjects the digital signal having the sampling frequency $M \cdot F_s$ to a digital-to-analog (D/A) conversion, and produces an analog signal having a frequency spectrum shown in FIG. 2(D). This analog signal from the D/A converter 14 is supplied to an analog lowpass filter 15. A known integrated circuit (IC), for example, a chip MP-1926A manufactured by ANALODIC of the United States, may be used for the D/A converter 14.

Figure 3:
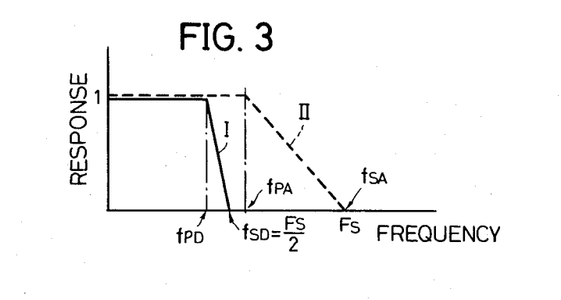
FIG. 3 is a graph showing amplitude versus frequency characteristics of a digital lowpass filter and an analog lowpass filter within the block system shown in FIG. 1.

The analog lowpass filter 15 has an amplitude versus frequency characteristic indicated by a broken line II in FIG. 3. In this characteristic, a passband edge frequency $f_{PA}$ is selected to a frequency higher than or equal to $F_s/2$, and a stopband edge frequency $f_{SA}$ is selected to a frequency substantially equal to or lower than $(M+1)F_s/2$. Since M is equal to 2 in this case, the stopband edge frequency $f_{SA}$ is equal to the frequency $F_s$, for example. Accordingly, unwanted frequency components higher than or equal to $(M+1)F_s/2$ included within the output digital signal of the D/A converter 14 is eliminated by the analog lowpass filter 15. The output analog signal of the analog lowpass filter 15, which has a frequency spectrum shown in FIG. 2(E), is produced through an output terminal 16.

Figure 4:
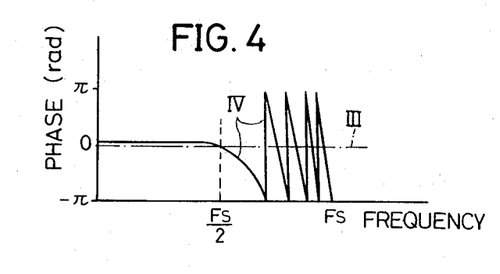
FIG. 4 is a graph showing phase versus frequency characteristics of the digital lowpass filter and the analog lowpass filter within the block system shown in FIG. 1.

According to the present embodiment, the digital lowpass filter 112 has the amplitude versus frequency characteristic indicated by a solid line I in FIG. 3 and the transition band between the stopband edge frequency $f_{SD}$ and the passband edge frequency $f_{PD}$ is narrow, however, the digital filter may be designed with high precision. Moreover, the signal-to-noise (S/N) ratio does not become deteriorated because the processing carried out is a digital signal processing. If the digital lowpass filter 112 is constituted by an FIR digital filter, the phase versus frequency characteristic becomes as shown in FIG. 4 which is a linear phase, and the signal quality does not become deteriorated by phase distortion.

On the other hand, the D/A converter 14 is designed to convert the digital signal having the sampling frequency M·$F_s$ into an analog signal. Thus, the analog lowpass filter 15 is provided at the output stage of the D/A converter 14, so as to eliminate the unwanted frequency components. As described before, the analog lowpass filter 15 has an amplitude versus frequency characteristic indicated by a broken line II in FIG. 3, and the transition frequency band between the stopband edge frequency $f_{SA}$ and the passband edge frequency $f_{PA}$ is considerably wider compared to the transition frequency band of the conventional analog lowpass filter. For this reason, a desired attenuation can be obtained with a gradual transition between the stopband edge frequency and the passband edge frequency. For example, in the characteristic shown in FIG. 3, if the passband edge frequency $f_{PA}$ is in the range of 30 kHz and the stopband edge frequency $f_{SA}$ is in the range of 50 kHz, it will be sufficient to obtain an attenuation of $-96$ dB in a wide transition frequency band of approximately 20 kHz which is approximately four times the transition frequency band obtained in the conventional analog lowpass filter.

Figure 5:
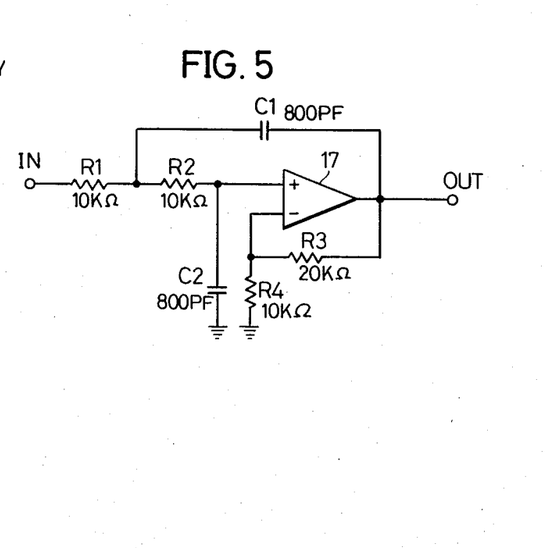
FIG. 5 is a concrete circuit diagram showing an embodiment of an analog lowpass filter within the D/A converting device according to the present invention.

Accordingly, the designing of the analog lowpass filter 15 is facilitated compared to the designing of the conventional analog lowpass filter, and the scale of the lowpass filter 15 can be small. In addition, there is substantially no deviation from the designed values due to inconsistencies in the circuit elements. Further, the analog lowpass filter 15 has a phase versus frequency characteristic indicated by a solid line IV in FIG. 4. That is, the characteristic shows an approximately linear phase at least in a frequency band lower than or equal to $F_s/2$, and there is substantially no phase distortion in the frequency band which is finally utilized. The above analog lowpass filter 15 may have a simple circuit construction shown in FIG. 5, for example, wherein the analog lowpass filter 15 comprises an operational amplifier 17, resistors R1 through R4, and capacitors C1 and C2.

Therefore, due to the improved phase versus frequency characteristic of the analog lowpass filter 15, the signal quality of the analog signal obtained through the output terminal 16 is improved compared to the signal quality obtained by the conventional device.

The mean of frequency components in the fundamental frequency band of the output signal of the D/A converter 14 is obtained by the analog lowpass filter 15, and the frequency components within or higher than the fundamental frequency band are eliminated. Hence, a hypothesis may be made that the original analog signal within the fundamental frequency band which is to be subjected to the D/A conversion and restored, is equal to the output signal of the analog lowpass filter 15, within a predetermined time interval. That is, the following equation (2) can be derived if a circuit part constituted by the sampling rate converter 11 and the signal processing circuit 12 shown in FIG. 1 is assumed to be one block, where $z_n$ is an l-bit output signal.

$$\sum_{i=0}^{N} z_{n-i} = \sum_{i=0}^{N} x_{n-i} \tag{2}$$

For convenience' sake, the equation (2) may be rewritten as the following equation (3) if it is assumed that $N=1$.

$$z_n = x_n + (x_{n-1} - z_{n-1}) \tag{3}$$

If it is assumed that the value of the signal at the time nT is identical to the value of the input digital signal $y_n$ of the D/A converter 14 with respect to the signal within the fundamental frequency band, the equation (3) may be rewritten as the following equation (4).

$$y_n = x_n + (x_{n-1} - y_{n-1}) \tag{4}$$

That is, the equation (4) corresponds to the equation (1) for the case where $N=1$, and this equation (4) indicates that all of the processing can be carried out with respect to the digital signal. Accordingly, if $x_n$, $x_{n-1}$, and $y_{n-1}$ are known, $y_n$ may be described by a linear combination of $x_n$, $x_{n-1}$, and $y_{n-1}$, and $y_n$ can be obtained by a digital signal processing.

Therefore, it may be seen that when $N=1$ in the signal processing circuit 12, the quantization error is reduced by feeding back and adding an error component between the input digital signal $x_{n-1}$ and the quantized signal $y_{n-1}$ to the digital signal $x_n$ which is obtained at a subsequent time. It is assumed that $y_{n-1}$ and $y_n$ can be described by the following equation (5).

$$\left. \begin{array}{l} y_{n-1} = x_{n-1} + \delta_1 \\ y_n = x_n - \delta_n \end{array} \right\} \tag{5}$$

If the following equation (6) stands, it may be assumed that $x_n$ and $x_{n-1}$ are substantially being produced at the output of the analog lowpass filter 15 when $\delta$ in the equation (6) becomes equal to zero.

$$\delta = \delta_1 - \delta_2 \approx 0 \tag{6}$$

Accordingly, the quantization noise is reduced when the means is obtained with respect to time. Description was given heretofore for a case where $N=1$, however, similar results are obtained when $N=2$.

As described heretofore, by designing the signal processing circuit 12 so as to satisfy the difference equation (1), the resolution of the D/A converter system is increased in essence by at least one or more bits, and the quantization noise is reduced according to this improved resolution.

Figure 6:
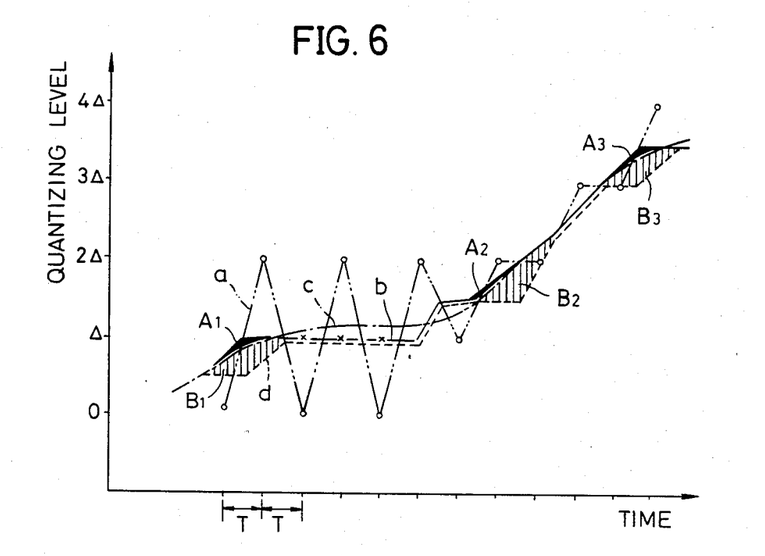
FIG. 6 is a graph for comparing changes in values of the input digital signal and values of the original analog signal, with respect to a D/A converter within the D/A converting device according to the present invention and a D/A converter within a conventional D/A converting device using the noise shaping method.

In FIG. 6, a two-dot chain line a connecting the circular marks, shows the change in values of the input digital signal of the D/A converter 14 in the device according to the present invention. When the mean is obtained with respect to time by the analog lowpass filter 15, a solid line b connecting the cross marks is obtained. This line b closely resembles the original analog signal indicated by a one-dot chain line c. Thus, the error component of the output analog signal obtained through the output terminal 16 with respect to the original analog signal, corresponds to the regions between the line b and the one-dot chain line c in FIG. 6. That is, the dark areas A1, A2, and A3 in FIG. 6 correspond to the error component.

On the other hand, according to the conventional D/A converting device which employs the noise shaping method described previously, the values of the output analog signal obtained from the D/A converter through the analog lowpass filter change as indicated by a broken line d in FIG. 6. That is, the resolution is increased by one bit when the values change within the minimum quantization level Δ, however, the digital signal assuming values close to the quantization value ($\Delta$, $2\Delta$) pass unchanged. For this reason, the quantization error of the signals having the values close to the quantization value becomes close to zero, and the feedback quantity becomes equal to zero, which means that the output value becomes equal to the quantization level. Accordingly, the error component of the output analog signal obtained from the D/A converter through the analog lowpass filter with respect to the original analog signal, corresponds to the regions between the broken line d and the one-dot chain line c in FIG. 6. That is, the error component can be indicated by areas B1, B2, and B3 indicated by hatchings in FIG. 6.

Hence, by comparing the areas A1 through A3 and the areas B1 through B3 in FIG. 6, it may be seen that the error component of the output analog signal obtained according to the device of the present invention with respect to the original analog signal, is considerably smaller than the error component of the output analog signal obtained by the conventional device employing the noise shaping method with respect to the original analog signal.

Figure 7:
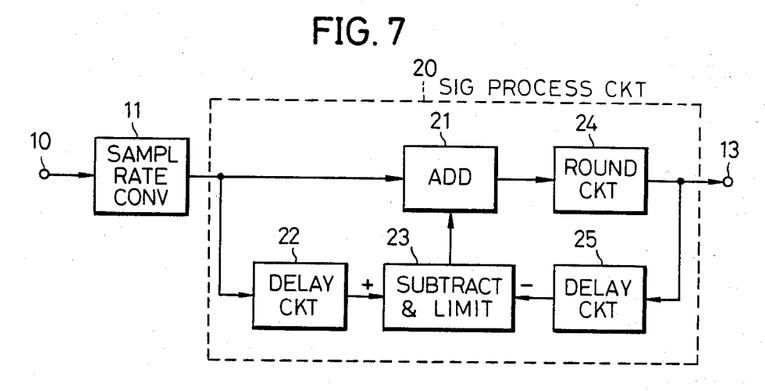
FIG. 7 is a systematic block diagram showing a first embodiment of an essential part of the block system shown in FIG. 1.

Next, description will be given with respect to embodiments of the signal processing circuit. FIG. 7 shows a systematic block diagram of an essential part of the device according to the present invention. In FIG. 7, those parts which are the same as those corresponding parts in FIG. 1 are designated by the same reference numerals, and description thereof will be omitted.

A signal processing circuit 20 in FIG. 7 shows a first embodiment of the signal processing circuit 12 shown in FIG. 1. The signal processing circuit 20 is designed so as to satisfy the equation (1) described before for a case where N=1, that is, so as to satisfy the equation (4). The signal processing circuit 20 comprises an adder 21, a delay circuit 22, a subtracting and limiting circuit 23, a rounding circuit 24, and a delay circuit 25. The subtracting and limiting circuit 23 comprises a subtracting circuit and a limiter. The digital signal obtained from the sampling rate converter 11, is supplied to the adder 21 and to the delay circuit 22. A digital signal which is delayed by one sampling period T in the delay circuit 22, is supplied to the subtracting and limiting circuit 23. In the subtracting circuit within the subtracting and limiting circuit 23, a subtraction is carried out between the digital signal obtained from the delay circuit 22 and an output digital signal which has been delayed by one sampling period T in the delay circuit 25. The limiter within the subtracting and limiting circuit 23 operates so that an output value is amplitude-limited to within a range between the value of $\delta$ in the equation (6) and three times the value of $\delta$. The limiter within the subtracting and limiting circuit 23 is provided to prevent oscillation, and prevents the value of the digital signal from undergoing change which is larger than the quantization level.

A difference signal obtained from the subtracting and limiting circuit 23 is supplied to the adder 21 wherein the difference signal added with the digital signal from the sampling rate converter 11. An output signal of the adder 21 is supplied to the rounding circuit 24 wherein the input of k bits is rounded into l bits. An output signal of the rounding circuit 24 is supplied to the delay circuit 25 and to the output terminal 13.

Figure 8:
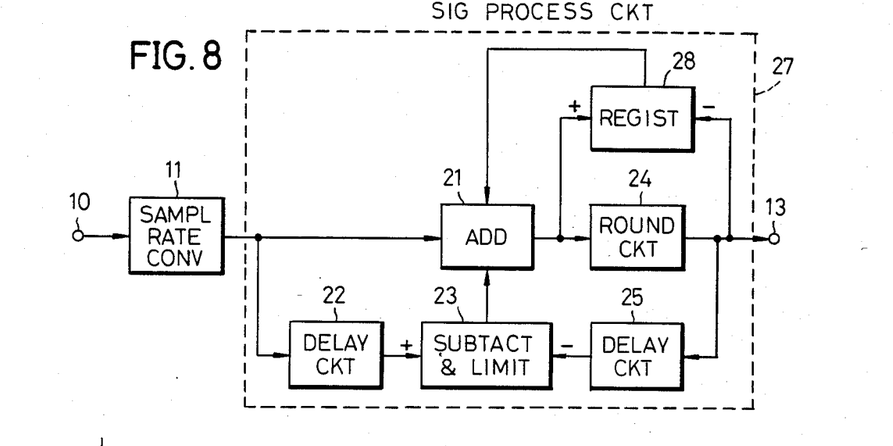
FIG. 8 is a systematic block diagram showing a second embodiment of an essential part of the block system shown in FIG. 1.

Next, description will be given with respect to a second embodiment of the signal processing circuit 12, by referring to FIG. 8. The construction of a signal processing circuit 28 shown in FIG. 8 is substantially the same as the construction of the signal processing circuit 20 shown in FIG. 7. However, in this second embodiment, a register 28 is additionally provided. This register carried out a subtraction between the input and output digital signals of the rounding circuit 24, and accumulates the error components for the case where $\delta$ 0 in the equation (6). When the accumulated error component becomes equal to the minimum quantization level $\Delta$, the register 28 supplies this accumulated error component to the adder 21. Further, because the register 28 eliminates the D.C. component, this register 28 is also a type of an integrator.

Figure 9:
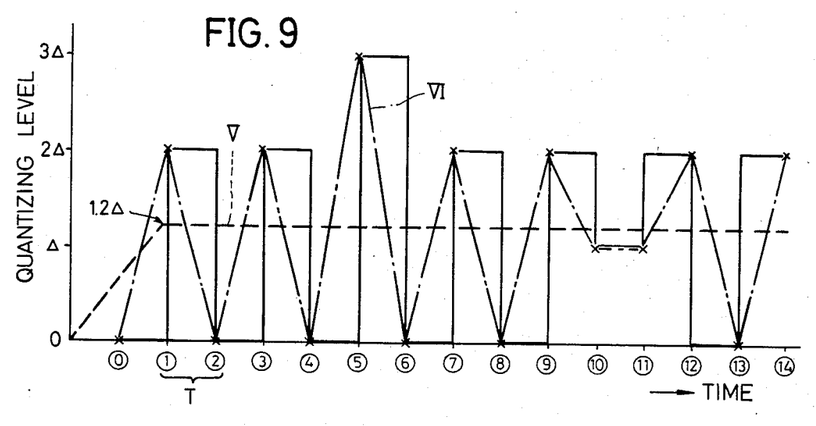
FIG. 9 is a graph for comparing an example of changes in values of the output digital signal of a signal processing circuit within the D/A converting device according to the present invention and values of the original analog signal.

According to the present embodiment, a digital signal assuming values indicated by the cross marks in FIG. 9 is obtained through the output terminal 13 for every sampling period T, with respect to the values of the output digital signal of the sampling rate converter 11 indicated by a broken line V in FIG. 9. The change in the values indicated by the cross marks is indicated by a one-dot chain line in FIG. 9. The output digital signal obtained through the output terminal 13 is passed through the D/A converter 14 and the analog lowpass filter 15 in the subsequent stages. Thus, the output digital signal obtained through the output terminal 13 is finally obtained as an analog signal which is described by the mean of values (quantization level) at mutually adjacent sampling points.

As seen from FIG. 9, the quantization level of the input digital signal of the signal processing circuit 27 is 1.2$\Delta$. On the other hand, if it is assumed that a digital signal having a quantization level of zero and a digital signal having a quantization level of 2$\Delta$ are alternately obtained through the output terminal 13 with the sampling period T, the mean of these digital signals obtained through the output terminal 13 becomes equal to $\Delta$, which results in an error of 0.2$\Delta$ with respect to the above quantization level 1.2$\Delta$ of the input digital signal of the signal processing circuit 27. However, according to the present embodiment, the quantization level of the digital signal obtained through the output terminal 13 changes as indicated by the cross marks in FIG. 9. That is, the quantization level is 3 at the fifth sampling point 5 , and $\Delta$ at the tenth and eleventh sampling points 10 and 11 , and the sum of the quantization levels for a total of fourteen sampling points is 17. When the mean quantization level of this total of fourteen sampling points is obtained with respect to time in the analog lowpass filter 15, the mean becomes equal to 1.21$\Delta$ (=17$\Delta$/14). Thus, by comparing this mean quantization level 1.21$\Delta$ with the quantization level 1.2 of the input digital signal, it can easily be seen that the error is substantially cancelled and that the mean quantization level closely resembles the quantization level of the input digital signal. It should be noted that the limiting amplitude of the limiter within the subtracting and limiting circuit 23 is set so that the values of $\delta_1$ and $\delta_2$ in the equation (5) do not become less than 2$\Delta$.

Next, description will be given with respect to a quality rating of the analog signal which is obtained by the device according to the present invention. There is no established quality rating for a digital signal, especially for a digital audio signal. However, there presently is a known quality rating which employs noise variance. Thus, the present inventor has rated the signal quality by a quality rating which employs the noise variance, and also the harmonic distortion and cross modulation distortion. Such a quality rating was carried out by computer simulation by quantitative analysis.

Accordingly, a digital filter which operates at a sufficiently high sampling frequency was used as the analog lowpass filter 15, so that the transmitted signal is unaffected. For the purpose of preventing aliasing distortion, the digital filter used was designed to have a passband edge frequency which is four times the sampling frequency $F_s$. In addition, the input signal frequency applied to the input terminal 10 was set to zero to 5 kHz, the sampling frequency $F_s$ to 12 kHz, number of bits of the input signal to 8 bits, and the number of bits (resolution) of the D/A converter 14 to 8 bits. An FIR digital filter having its order of the filter set to 146, the passband ripple to 0.01 dB, the passband edge frequency $f_{PD}$ to 5 kHz, the stopband edge frequency $f_{SD}$ to 6 kHz, and the attenuation to $-50$ dB, was used for the digital lowpass filter 112 within the sampling rate converter 11. Further, a digital filter used for the analog lowpass filter 15 was designed similarly as this FIR digital filter.

Figure 10:
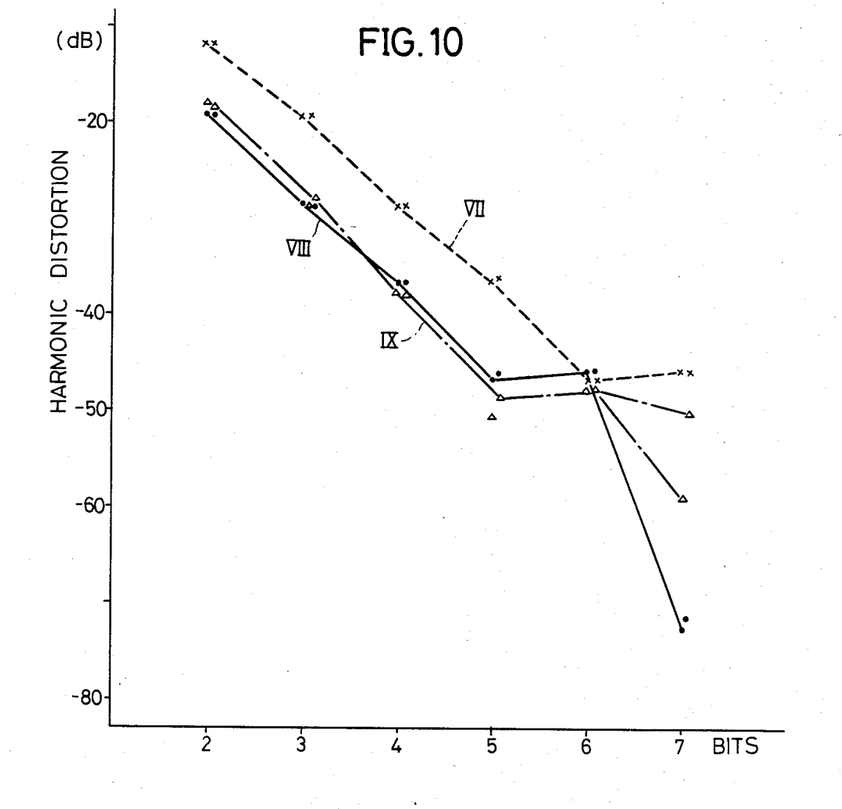
FIG. 10 is a graph for comparing harmonic distortion characteristics of the device according to the present invention, a conventional device, and a conventional device in which the resolution of the D/A converter is increased by one bit.

FIG. 10 shows the harmonic distortion of 23 Hz, and the harmonic distortion characteristic of the conventional device is indicated by a broken line VII. A solid line VIII indicates the harmonic distortion characteristic of the conventional device when the resolution of the D/A converter is increased by one bit. On the other hand, the harmonic distortion characteristic obtained by the device according to the present invention is indicated by a one-dot chain line IX in FIG. 10. It may be easily seen from comparing the harmonic distortion characteristic VII of the conventional device and the harmonic distortion characteristic IX of the device according to the present invention, that the harmonic distortion characteristic is improved according to the present invention. In FIG. 10, the two measured values in the above harmonic distortion characteristics VII, VIII, and IX are respectively indicated by cross marks, black circular marks, and triangular marks.

Figure 11:
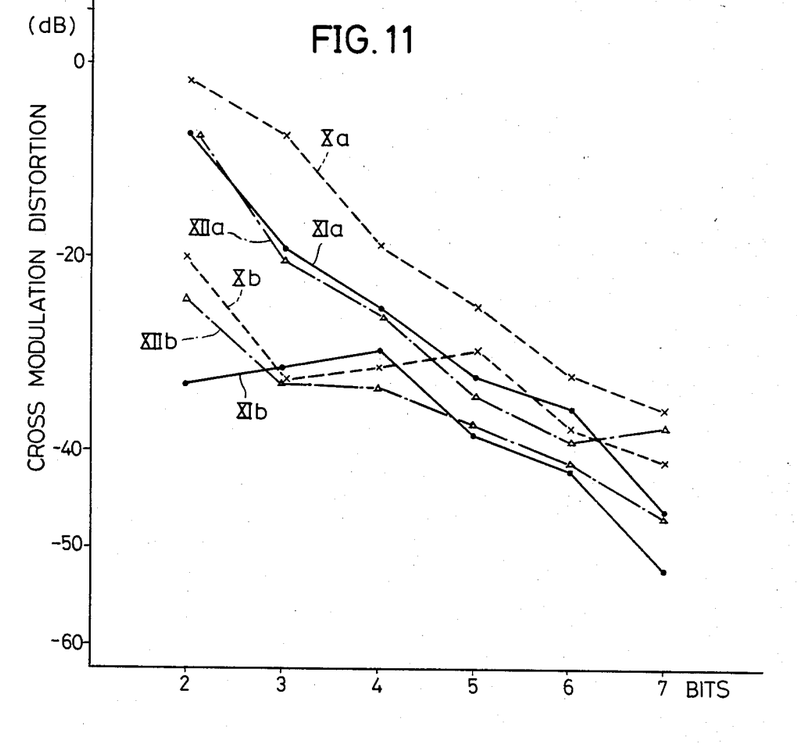
FIG. 11 is a graph for comparing cross modulation distortion characteristics of the device according to the present invention, a conventional device, and a conventional device in which the resolution of the D/A converter is increased by one bit.

FIG. 11 shows the cross modulation distortion characteristic. As in FIG. 14 which will be described hereinafter, FIG. 11 shows the cross modulation distortion characteristic obtained when the maximum value of the input signal level is assumed to be 1.0, and a signal having a level 0.47 with respect to the input signal level and a frequency of 23 Hz or 234 Hz and a signal having a frequency of 2.3 kHz are mixed with a level ratio of 4:1. In FIG. 11, the cross modulation distortion characteristics of the conventional device are indicated by broken lines Xa and Xb connecting the measured values which are indicated by cross marks. In addition, the cross modulation distortion characteristics of the conventional device when the resolution of the D/A converter is increased by one bit, are indicated by solid lines XIa and XIb connecting the measured values which are indicated by black circular marks. On the other hand, the cross modulation distortion characteristics of the device according to the present invention are indicated by one-dot chain lines XIIa and XIIb connecting the measured values which are indicated by triangular marks. It may be easily seen that the cross modulation distortion characteristics XIIa and XIIb respectively are substantially the same as the cross modulation distortion characteristics XIa and XIb. In FIG. 11, the cross modulation characteristics Xa, XIa, and XIIa are characteristics obtained when the signal having the frequency of 234 Hz and the signal having the frequency of 2.3 kHz are mixed, and the cross modulation characteristics Xb, XIb, and XIIb are characteristics obtained when the signal having the frequency of 23 Hz and the signal having the frequency of 2.3 kHz are mixed.

Figure 12:
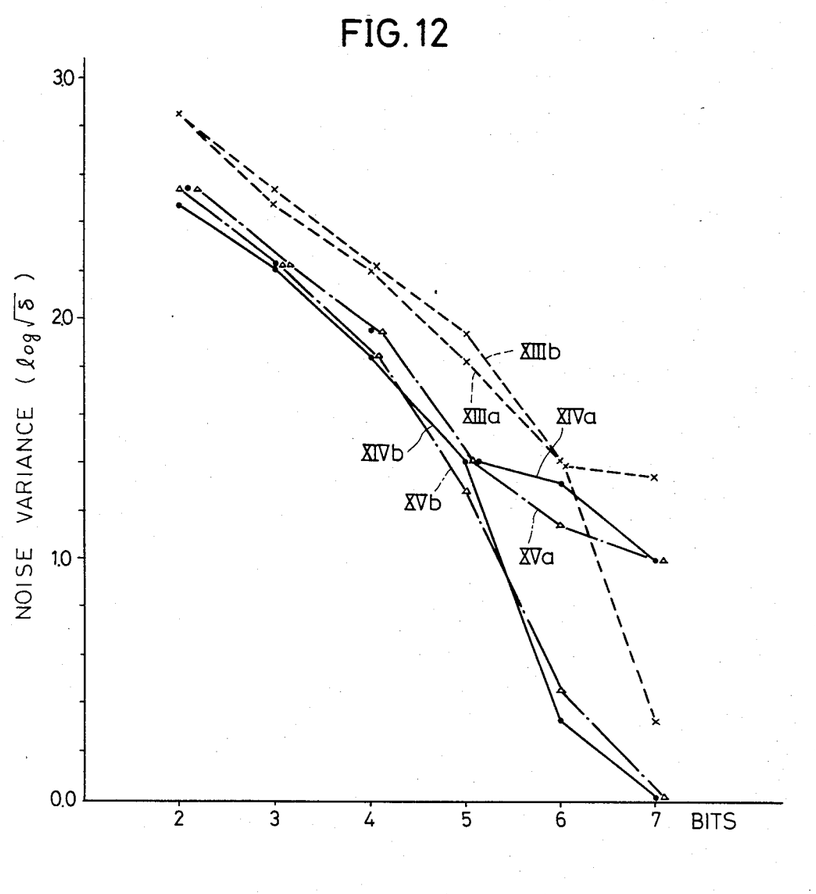
FIG. 12 is a graph for comparing noise variance characteristics of the device according to the present invention, a conventional device, and a conventional device in which the resolution of the D/A converter is increased by one bit.
Figure 14:
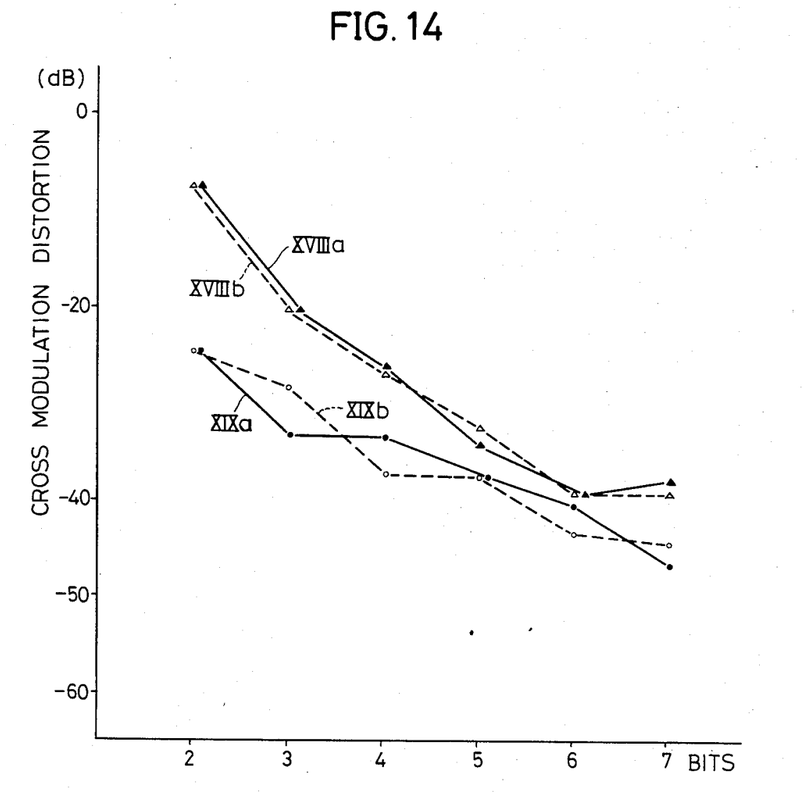
FIG. 14 is a graph showing cross modulation distortion characteristics of the device according to the present invention and a conventional device in which the resolution of the D/A converter is increased by one bit, according to the provision of a sampling rate converter.

FIG. 12 shows the noise variance characteristic. In FIG. 11, the noise variance characteristics of the conventional device are indicated by broken lines XIIIa and XIIIb connecting the measured values which are indicated by cross marks. In addition, the noise variance characteristics of the conventional device when the resolution of the D/A converter is increased by one bit, are indicated by solid lines XIVa and XIVb connecting the measured values which are indicated by black circular marks. On the other hand, the noise variance characteristics of the device according to the present invention are indicated by one-dot chain lines XVa and XVb connecting the measured values which are indicated by triangular marks. In FIG. 14, the noise variance characteristics XIIIa, XIVa, and XVa are characteristics at a certain frequency $f_1$, and the noise variance characteristics XIIIb, XIVb, and XVb are characteristics at a certain frequency $f_2$ which is lower than the frequency $f_1$. As easily seen from FIG. 12, the noise variance characteristics obtained by the device according to the present invention are substantially the same as the improved noise variance characteristics obtained by the conventional device in which the resolution of the D/A converter is increased by one bit.

Figure 13:
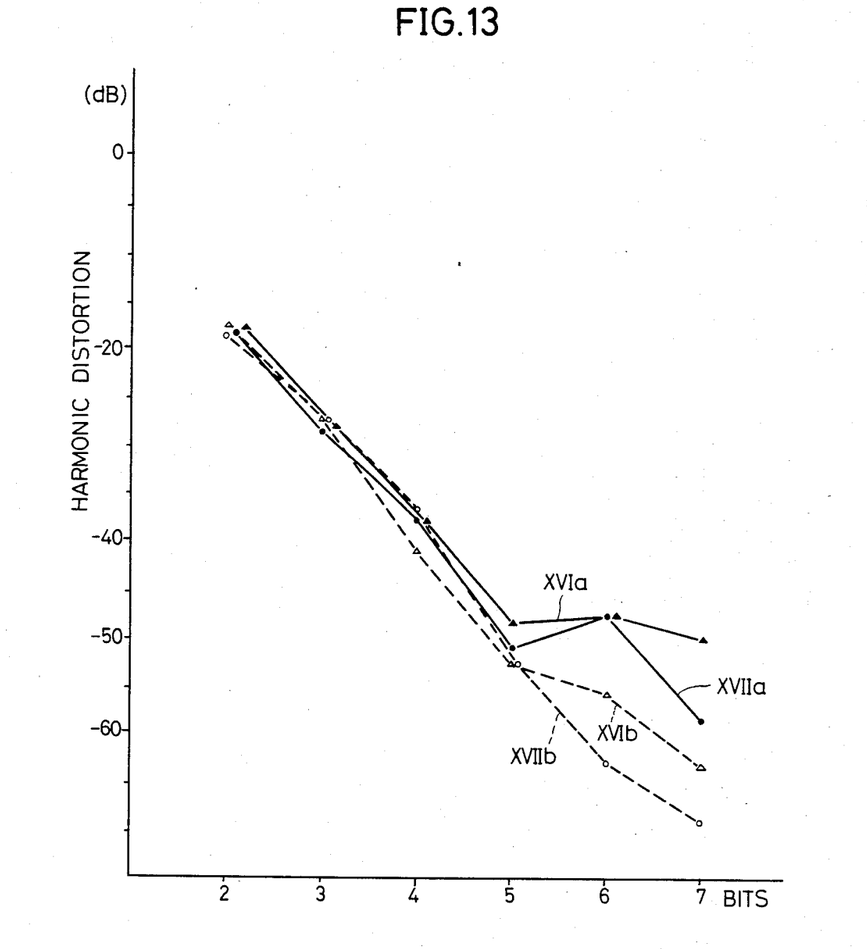
FIG. 13 is a graph showing harmonic distortion characteristics of the device according to the present invention and a conventional device in which the resolution of the D/A converter is increased by one bit, according to the provision of a sampling rate converter.

Further, FIG. 13 shows the harmonic distortion characteristic obtained according to the provision of the sampling rate converter 11. The white and black triangular marks indicate the harmonic distortion values obtained when the resolution of the D/A converter is increased by one bit in the conventional device, and the white and black circular marks indicate the harmonic distortion values obtained by the device according to the present invention. Moreover, harmonic distortion characteristics XVIa and XVIIa respectively connecting the black triangular marks and black circular marks, are characteristics obtained when the sampling rate converter 11 is not provided. On the other hand, harmonic distortion characteristics XVIb and XVIIb respectively connecting the white triangular marks and white circular marks, are characteristics obtained when the sampling rate converter 11 is provided. Accordingly, the harmonic distortion characteristics XVIb and XVIIb in FIG. 13 are substantially the same as the characteristics shown in FIG. 10. As evident from FIG. 13, the generation of the harmonic distortion is less when the sampling rate converter 11 is provided.

In addition, FIG. 14 shows the cross modulation distortion characteristic obtained according to the provision of the sampling rate converter 11. The white and black triangular marks indicate the cross modulation distortion values obtained when the resolution of the D/A converter is increased by one bit in the conventional device, and the white and black circular marks indicate the cross modulation distortion values obtained by the device according to the present invention. Moreover, cross modulation distortion characteristics XVIIIa and XIXa respectively connecting the black triangular marks and black circular marks, are characteristics obtained when the sampling rate converter 11 is not provided. On the other hand, cross modulation distortion characteristics XVIIIb and XIXb respectively connecting the white triangular marks and white circular marks, are characteristics obtained when the sampling rate converter 11 is provided. As seen from FIG. 14, the cross modulation distortion characteristic is substantially unaffected by the provision of the sampling rate converter 11.

It should be noted that the frequencies (23 Hz, 234 Hz, 2.3 kHZ, and the like) used for measuring each of the characteristics, were selected so that the effect of the window functions is minimum when performing the discrete Fourier transform (DFT).

As may be understood from FIGS. 10 through 14, the harmonic distortion characteristic, the noise variance characteristic, and the cross modulation distortion characteristic obtained by the device according to the present invention, are substantially the same as the characteristics obtained by the conventional device in which the resolution of the D/A converter is increased by one bit. Accordingly, the resolution of the D/A converter is in essence improved by substantially one bit. For this reason, the quantization noise is reduced according to this improved resolution of the D/A converter. Furthermore, if the noise variance is considered as being the S/N ratio, it may be seen from FIG. 12 that the S/N ratio does not deteriorate according to the device of the present invention, when compared to the conventional device employing the noise called dither. Moreover, by providing the sampling rate converter 11, there is substantially no deterioration of the signal within the high frequency band.

The present invention is not limited to the embodiments described heretofore, and for example, the effect of reducing the quantization noise can be obtained if the word length of the signal supplied to the signal processing circuit 20 in FIG. 7 is greater than the resolution of the D/A converter, even if the sampling rate converter 11 is not provided. In addition, the linear combination digital signal processing carried out in the signal processing circuit 12 simply needs to satisfy the equation (1), and is not limited to the equation (4). The present invention can also be applied to analog information signals other than the audio signal, such as a video signal.

Further, the present invention is not limited to these embodiments, but various variations and modifications may be made without departing from the scope of the present invention.

What is claimed is:

1. A digital-to-analog converting device comprising:
a signal processing circuit supplied with a discrete digital signal $x_n$ at a time nT, where n is a natural number and T is a sampling period, for converting said discrete digital signal $x_n$ into a digital signal $y_n$ satisfying an equation $$y_n = \sum_{i=0}^{N} x_{n-i} - \sum_{i=1}^{N} y_{n-i},$$

where N is a natural number greater than i;
a digital-to-analog converter for converting the output digital signal $y_n$ of said signal processing circuit into an analog signal having a continuous amplitude; and
an analog lowpass filter supplied with the output analog signal of said digital-to-analog converter, for eliminating frequency components substantially equal to or higher than ½ a sampling frequency $F_s$ of the discrete input digital signal of said signal processing circuit.

2. A digital-to-analog converting device as claimed in claim 1 which further comprises a sampling rate converter for converting said input discrete digital signal so that the sampling frequency $F_s$ thereof is multiplied by M, where M is a natural number greater than or equal to 2, and for supplying an output signal to said signal processing circuit, and said analog lowpass filter has a passband edge frequency selected to a frequency which is substantially equal to or higher than ½ said sampling frequency $F_s$ and a stopband edge frequency selected to a frequency which is substantially equal to or lower than (M+1)/2 times said sampling frequency $F_s$.

3. A digital-to-analog converting device as claimed in claim 1 in which said signal processing circuit comprises a first delay circuit for delaying said discrete input digital signal by one sampling period, a subtracting and limiting circuit supplied with an output signal of said first delay circuit, an adder for adding said discrete input digital signal and an output signal of said subtracting and limiting circuit, a rounding circuit for rounding a number of bits of an output signal of said adder and producing said output digital signal $y_n$, and a second delay circuit supplied with said output digital signal $y_n$ of said rounding circuit, for delaying said output digital signal $y_n$ by one sampling period, and said subtracting and limiting circuit carries out a subtraction between output signals of said first and second delay circuits and limits signal components greater than or equal to a predetermined quantization level.

4. A digital-to-analog converting device as claimed in claim 3 in which said signal processing circuit further comprises a register for carrying out a subtraction between the output signals of said adder and said rounding circuit, and said register supplies a value of a minimum quantization level when a value obtained as a result of the subtraction becomes equal to said minimum quantization level.

5. A digital-to-analog converting device as claimed in claim 2 in which said sampling rate converter comprises an interpolator for producing a digital signal having a sampling frequency which is in essence multiplied by M by inserting (M−1) zeros between each of sampled values of said input discrete digital signal having said sampling frequency $F_s$, and a digital lowpass filter supplied with an output digital signal of said interpolator, and said digital lowpass filter has a passband edge frequency selected to a frequency which is substantially lower than ½ said sampling frequency $F_s$ and a stopband edge frequency selected to a frequency which is substantially equal to or lower than ½ said sampling frequency $F_s$.

6. A digital-to-analog converting device as claimed in claim 5 in which said digital lowpass filter is constituted by a finite impulse response digital filter.

* * * * *